United States Patent [19]
Horton et al.

[11] Patent Number: 5,186,632
[45] Date of Patent: Feb. 16, 1993

[54] ELECTRONIC DEVICE ELASTOMERIC MOUNTING AND INTERCONNECTION TECHNOLOGY

[75] Inventors: Raymond R. Horton, Dover Plains; Ismail C. Noyan, Peekskill; Michael J. Palmer, Walden, all of N.Y.; Mark B. Ritter, Brookfield, Conn.

[73] Assignee: International Business Machines Corporation, Armonk, N.Y.

[21] Appl. No.: 762,977

[22] Filed: Sep. 20, 1991

[51] Int. Cl.$^5$ .............................................. H01R 9/09
[52] U.S. Cl. ........................................ 439/67; 439/65; 439/74; 439/77; 439/493; 439/629; 439/631
[58] Field of Search ...................... 439/59, 62, 65–67, 439/73, 74, 77, 91, 329, 493, 591, 629–631

[56] References Cited

U.S. PATENT DOCUMENTS

| | | | |
|---|---|---|---|
| 3,239,916 | 3/1966 | Love | 29/155.5 |
| 3,597,660 | 8/1971 | Jensen et al. | 317/101 |
| 3,663,921 | 5/1972 | Richard | 339/17 |
| 3,825,878 | 7/1974 | Finger et al. | 439/493 |
| 3,885,173 | 5/1975 | Lee | 310/9.4 |
| 4,003,621 | 1/1977 | Lamp | 339/59 |
| 4,008,300 | 2/1977 | Ponn | 264/104 |
| 4,194,800 | 3/1980 | Chow | 339/17 |
| 4,218,581 | 8/1980 | Suzuki et al. | 174/117 |
| 4,295,695 | 10/1981 | Dodds | 339/17 |
| 4,358,173 | 11/1982 | Conrad | 339/17 |
| 4,523,796 | 6/1985 | Rank | 339/17 |
| 4,643,498 | 2/1987 | Taniguchi | 339/17 |
| 4,643,499 | 2/1987 | Mitchell | 339/17 |
| 4,658,331 | 4/1987 | Berg et al. | 361/387 |
| 4,659,872 | 4/1987 | Dery et al. | 174/117 |
| 4,703,984 | 11/1987 | Mitchell | 439/70 |
| 4,783,719 | 11/1988 | Jamison et al. | 361/398 |
| 4,798,918 | 1/1989 | Kabadi et al. | 174/36 |
| 4,815,979 | 3/1989 | Porter | 439/493 |
| 4,830,623 | 5/1989 | Owens et al. | 439/71 |
| 4,867,689 | 9/1989 | Redmond et al. | 439/71 |

FOREIGN PATENT DOCUMENTS 59-91677 of 1984 Japan.

Primary Examiner—Paula A. Bradley
Attorney, Agent, or Firm—Daniel P. Morris; Alvin J. Riddles

[57] ABSTRACT

An interconnecting and mounting technology involving the use of elastomeric properties. A mounting member grips, in a notch, the edge of a device supporting planar member with the device conductors brought to that edge. Conductors are provided at the surface of the mounting member, contacting the device conductors in the notch, and connecting with external wiring conductors on an external wiring planar member. The external wiring to device conductor interconnecting conductors can be on flex tape including elastomeric contact adaptation. Retention force for mounting member compression and mounting member to external wiring planar member retention is provided.

15 Claims, 4 Drawing Sheets

U.S. Patent     Feb. 16, 1993     Sheet 1 of 4     5,186,632
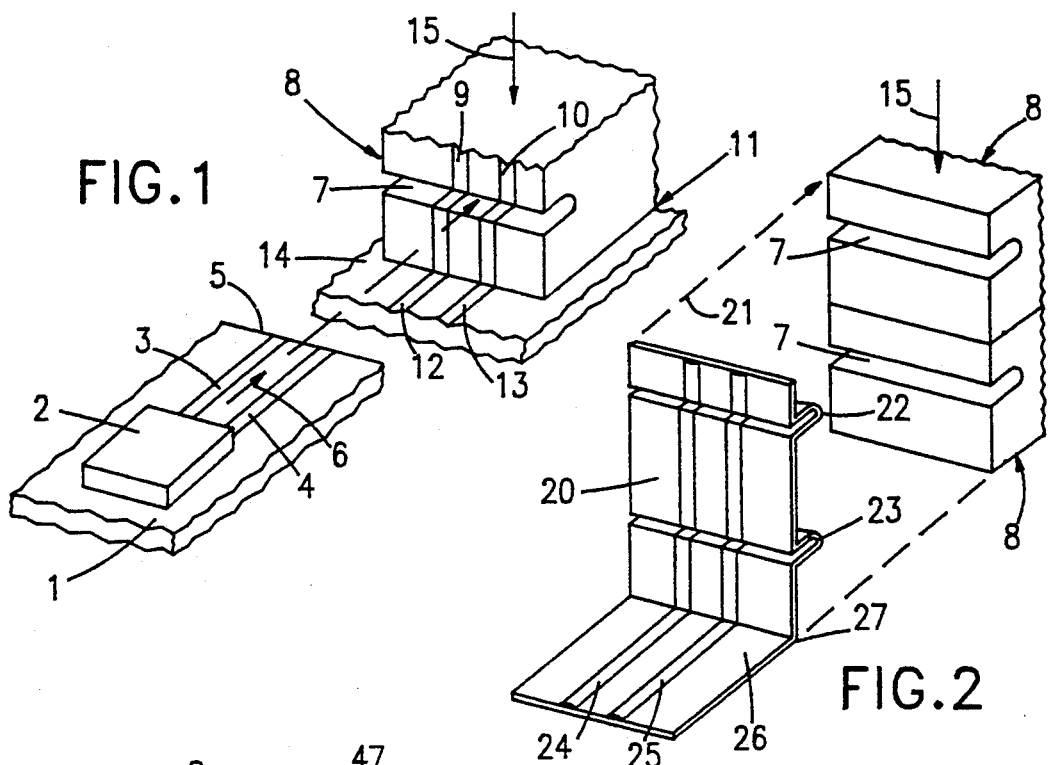
FIG. 1
FIG. 2
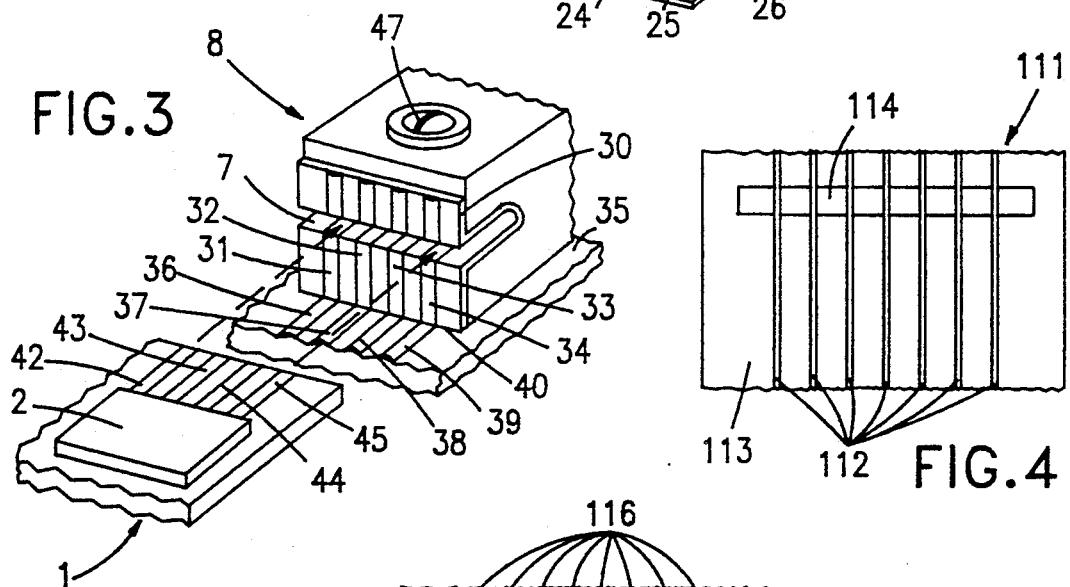
FIG. 3
FIG. 4
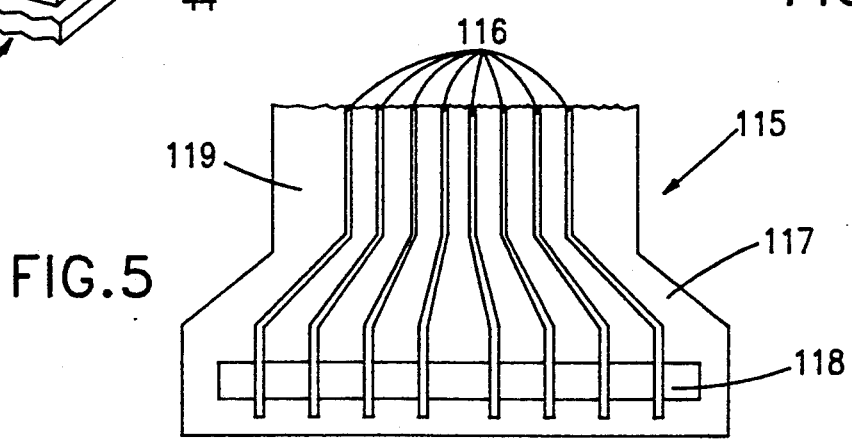
FIG. 5

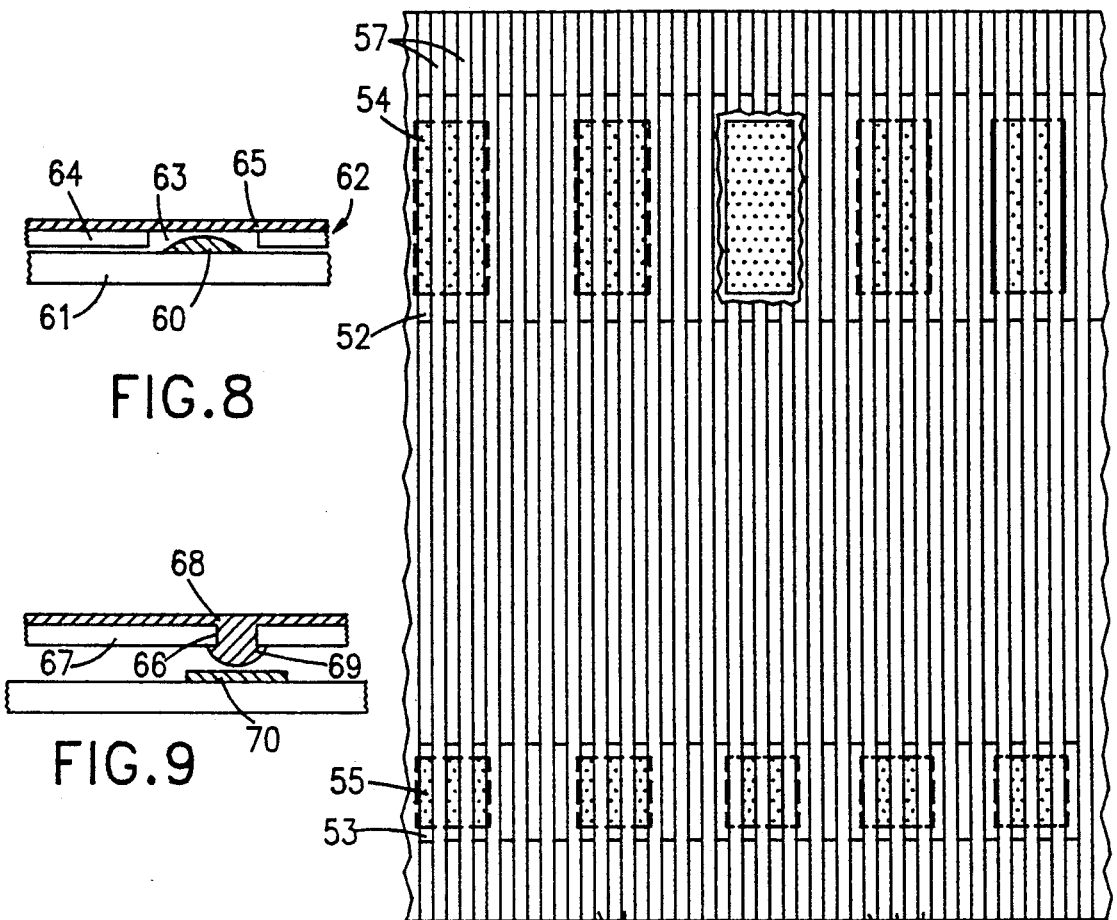
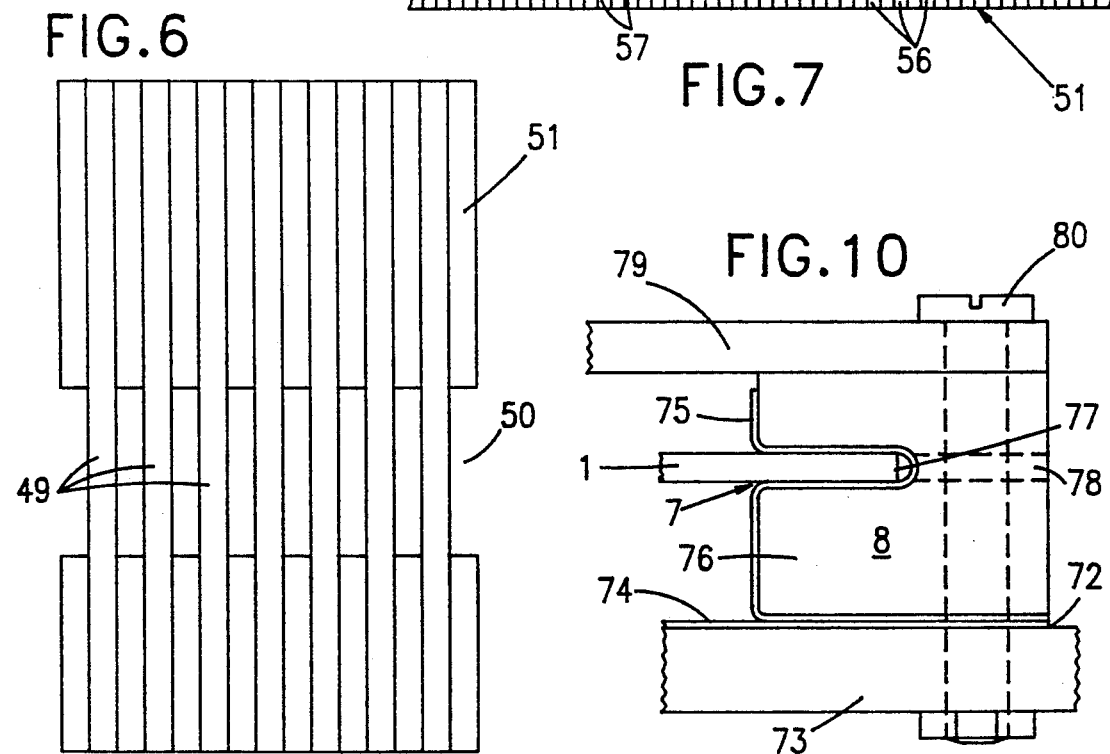

ELECTRONIC DEVICE ELASTOMERIC MOUNTING AND INTERCONNECTION TECHNOLOGY

FIELD OF THE INVENTION

The invention relates to the mounting and interconnection of electronic devices and in particular to the connection and mounting of such devices under conditions not requiring special tools or heat.

BACKGROUND OF THE INVENTION

As complexity and miniaturization in electronic apparatus increases, the need for smaller sizes, higher reliability and the ability to service and assemble under field conditions where the miniaturized apparatus is likely to be used, also increases. In electronic device packaging, the electronic devices are usually mounted on, or are in, a planar, device supporting substrate member with electrical connections to the devices being at the edge of the substrate. The planar substrate is in turn mounted in a fixed position in relation to another planar, external wiring supporting member such as a printed wiring board and interconnections are provided between the conductors on the wiring board and the electrical connections at the edge of the device supporting substrate.

As miniaturization progresses, the electrical connections in electronic packaging systems have become the most fragile and failure prone aspect of the entire system.

Heretofore, much effort in the art has been directed to making those electrical connections using fusion, such as soldering and thermocompression bonding. Where there is a need for assembly and servicing under field type conditions, the precision equipment needed for tightly controlled thermal excursion connections is seldom available. Similarly, under such conditions, equipment for precision positioning of parts is also seldom available.

Under these circumstances, attention is being given in the art to the use of interconnecting arrangements that permit manual assembly and disassembly with minimal temperature and positioning control considerations.

One technique receiving attention in the art involves the use of elastomeric materials that apply constant pressure when distorted. In one such system, elastomeric members provide constant contacting pressure to pin connectors under a frame compressed with a cam mechanism. This is shown in U.S. Pat. No. 4,867,689. In another system, elastomeric properties are employed with highly conductive regions as connecting members. This is shown in U.S. Pat. Nos. 4,643,498 and 4,643,499. The U.S. Pat. No. 4,643,498 patent also shows a slot for holding a substrate. In this type of system, there are limits to control of the dimensions of the conductive region that may affect density and signal response and also may affect positioning where the precise location of the conductive regions is not always visible.

There is a technology involving a flexible tape with an insulating material that supports precisely positioned conductors, known in the art as flex tape, that is well developed to the level of being able to provide precision electrical impedance matching. This technology is employed in U.S. Pat. No. 4,830,623 with a frame type compression system. The flex tape technology is also used in Japan document 59-91677 to provide an interconnection, using pins for attachment into external wiring, with attachment to the conductor pads at the edge of a device supporting substrate being made by clips.

SUMMARY OF THE INVENTION

In the electronic device interconnecting technology of the invention, in connection with a mounting member with a device supporting planar member, edge gripping notch, slot or groove, there is provided; elastomeric properties for grip and conductor contact compression enhancement; surface positioned interconnecting conductors connecting the external wiring to the device supporting member conductors and associated retention capability providing groove compression and mounting member to planar wiring supporting member retention. Flex tape is employable in providing the conductors from the external wiring to around the edge of the device supporting planar member in the groove with connections enhanced by adapting the tape by localized removal of the insulating backing in the locality where elastomeric pressure joining conductors occurs. The flex tape can be adapted to provide elastomeric properties. The mounting member can retain the device supporting planar member in parallel or angular relationship to the planar external wiring member. Mounting members may be stacked for providing superimposed device supporting planar members.

BRIEF DESCRIPTION OF THE DRAWINGS

FIG. 1 is a schematic perspective of the invention showing: the mounting element with the device planar member in insertion position, the interconnecting conductors, the external wiring and retention force.

FIG. 2 is a schematic perspective of stacked mounting elements with common flex tape in insertion position.

FIG. 3 is a schematic perspective of the mounting element with flex tape inserted and connecting to conductors on the planar wiring member and with device substrate in insertion position.

FIG. 4 is a schematic top view of a section of a flex tape illustrating an elastomeric responsive conductor contacting region.

FIG. 5 is a schematic top view of a section of an expanded conductor pattern flex tape illustrating an elastomeric responsive conductor contacting region.

FIG. 6 is an expanded, schematic view of a section of an elastomeric responsive conductor contacting region in a flex tape indicating opening size.

FIG. 7 is a schematic view of a fine conductor pitch flex tape with elastomeric responsive conductor contacting regions that span more than one conductor where contact pads are of different sizes and different pitch.

FIG. 8 is a schematic view of a flex tape with an elastomeric responsive conductor contacting region positioned over a bump type contact.

FIG. 9 is a schematic view of a flex tape with a via bump type elastomeric responsive conductor contact.

FIG. 10 is a side view of a mounting and interconnection assembly.

DESCRIPTION OF THE INVENTION

Figure 11:
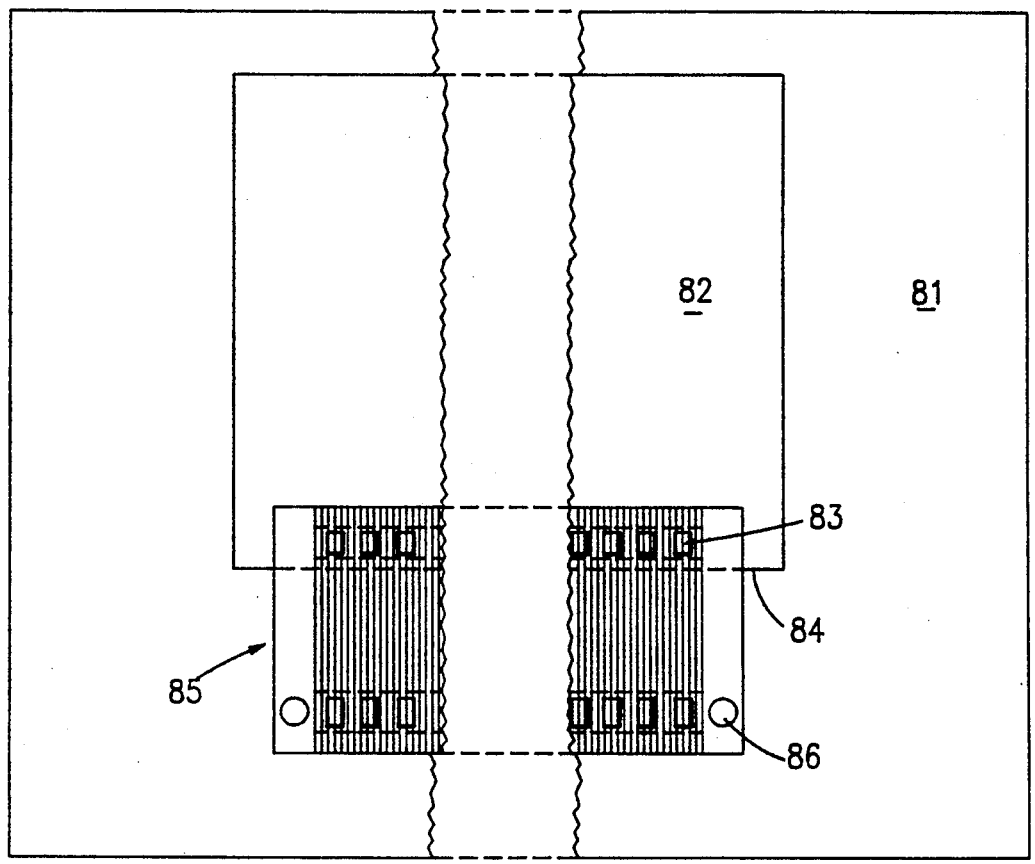
FIG. 11 is a top view of a schematic assembly apparatus for flex tape with elastomeric responsive conductor contacts.

In the mounting and interconnecting of electronic devices, the devices themselves are supported on a planar member and electrical signal conductors are provided on the planar device supporting member, extending to the edge thereof. Included in this type of structure are integrated circuits where the device interconnects are brought to the edge of the substrate, discrete devices on printed circuit cards and multiple semiconductor chips discrete and integrated on a planar carrier such as a printed circuit card or a silicon wafer carrier. The device supporting assembly is in turn held in a fixed position with relation to another planar support member that carries the external wiring for the overall apparatus with electrical conductors being provided that join the external wiring conductor pattern to the device conductor pattern at the edge of the device supporting planar member.

Referring to FIG. 1, there is shown a schematic illustration of the invention. A device supporting planar member 1 having a device 2 positioned thereon with electrical signal conductors 3 and 4 extending from the device 2 to the edge 5 of the member 1, is positioned as indicated by the dashed arrow 6, for insertion into a notch, slot or groove 7, in a body or mounting element 8. The mounting element 8 has surface positioned interconnecting conductors 9 and 10 that follow into the groove 7 making contact with the conductors 3 and 4, respectively, and extend out of view on the lower surface of the mounting element 8 where connections are made at the interface 11 to external wiring conductors 12 and 13, respectively, on the external wiring supporting member 14. The mounting element 8 further has elastomeric properties that enhance gripping of the device planar member 1 in the groove 7 and enhance contact between conductors 3 and 4 and 9 and 10 in the groove 7 and between 9 and 10 and 12 and 13 at the mounting member 8 external wiring planar member 14 interface 11. Pressure capability is shown symbolically as arrow 15 applied to the member 8 in a direction providing compression of the groove 7 and at the interface 11 which enhances gripping of the device planar member 1 and the conductor connections 3 to 9, 4 to 10, 9 to 12 and 10 to 13.

The mounting element 8 may be made of an elastomeric material such as silicone rubber or can merely have an elastomeric coating in the groove 7 and where needed for connection enhancement such as the interface 11.

The pressure 15 can be applied using such items as a pressure plate or bolt extending through the external wiring planar element 14 or both.

While the conductors 9 and 10 can be applied by standard deposition techniques, a particularly advantageous and preferred arrangement in accordance with the invention is the use of the flex tape type element well known in the art. In general, flex tape has a flexible insulating member in tape form with at least one longitudinal conductor. The technology of flex tape is well developed with variations in layers for ground planes and conductor pitch to provide considerable ability to specify signal propagation and current carrying capacity. The flex tape can also be adapted to provide the elastomeric properties in connecting and retaining the device supporting planar member.

Referring next to FIG. 2, a schematic perspective illustration is provided showing a flex tape in position for insertion. A feature of the invention is the ability to stack mounting elements to assemble superimposed device planar members. In FIG. 2, two mounting elements 8 are stacked and a common flex tape 20 is shown as indicated by the dashed arrow 21 ready to have portions 22 and 23 thereof inserted in the grooves 7. Exemplary conductors 24 and 25 provide interconnecting conductors from the external wiring, not shown, to conductors at the edge of the device planar members, not shown, when those planar members are inserted into the grooves 7. The conductors 24 and 25 can be bonded to the conductors on the external wiring planar member or preferably the section 26 of the flex tape 20 can be folded at 27 back under the lower mounting element 8 to be compressed under the pressure shown by arrow 15 thereby providing good conductor contact.

The use of the flex tape is further illustrated in connection with FIG. 3 which is a schematic perspective view of the mounting element 8 with a flex tape member 30 with an exemplary four conductors 31, 32, 33 and 34, with a portion thereof inverted into and around the groove 7 in contact with one face of the mounting element 8. The mounting element 8 is in contact with an external wiring planar member 35 with an exemplary four conductors 36, 37, 38 and 39 thereon. The flex tape 30 is folded beneath the mounting element 8 into the interface 40 where the conductors 31–34 contact the conductors 36–39. The conductors on the mounting element 8 as in FIG. 1 or on the flex tape 30 in FIG. 3 are easily alignable since the intersection of both sets of conductors is clearly visible at the intersection of the external wiring planar member 35 and the mounting element 8 at the edge of the interface 40. In the perspective view of FIG. 3, the device 2 supporting planar member 1 having an exemplary four conductors 42, 43, 44 and 45 going from the device 2 to the edge 46 of the device supporting member 1 is positioned for insertion into the groove 7 wherein the conductors 42–45 will be in contact with the conductors 31–34. The pressure 15 of FIG. 1 is shown in FIG. 3 as element 47, the slotted screw head of a bolt that extends, not shown, through the mounting element 8 and the external wiring planar member. The pressure exerted through element 47 compresses the groove 7 where the combined deformation and elastomeric properties enhance the gripping of the device supporting member 1 in the vicinity of the edge 46 and insure good movement free low resistance contact between conductors 42 and 31, 43 and 32, 44 and 33 and 45 and 34. The pressure exerted through element 47 also compresses the interface 40 which together with the elastomeric properties of the mounting element 8 insures good movement free low resistance contact between conductors 31 and 36, 32 and 37, 33 and 38 and 34 and 39. Thus, a good movement free, low resistance, impedance matched where desired, electrical path, is provided from the external wiring conductors to the devices.

The technology of the invention provides connections in densities of the order of 600 per square inch. In FIG. 3 the flex tape is illustrated with the conductors on the side facing the edge of the device supporting planar member in the groove. As the number of conductors increase and where the device supporting planar member is sharp, there are advantages in providing an adaptation to the flex tape that permits using the insulating properties of the backing of the tape while employing elastomeric properties in the groove of the mounting element in making contact.

In FIGS. 4-7, a portion of flex tape is shown adapted for elastomeric enhanced contacting by removal of a portion of the insulating backing in the contacting area leaving the conductors unsupported in the area. The insulating backing insulates and protects the conductors except at the contacting location where elastomeric properties force the conductors through the opening in the insulating backing and into contact with conductors on other parts of the packaging such as the edge of the device supporting planar member and the conductors on the external wiring supporting member.

Referring to FIG. 4, the flex tape 111 has a plurality shown illustratively as eight conductors 112 on an insulating backing 113. In the area where contacting is to take place, such as in the portion that would go around the edge of the device supporting planar member in the groove, an opening 114 is provided in the insulating backing so that the conductors 112 can be forced by the elastomeric properties in the mounting element groove to bring the conductors into contact with the device conductors at the edge of the device supporting planar member. Similarly, as illustrated in FIG. 5, a flex tape 115 has a series of parallel conductors 116 that fan out in a region 117 has a portion 118 of the insulating backing 119 removed in the contacting area so that the conductors 116 are unsupported across the removed portion and thereby can be brought into contact with conductors that the insulating backing is resting against.

Referring next to FIG. 6 which shows a top view of the conductors 49 crossing an opening 50 in the insulating backing 51. If the thickness of the insulating backing were great, this fact would have to be taken into consideration in determining the length of unsupported conductor but since a typical flex tape has a polyimide insulating backing of about 0.002 inches on which are deposited Cu conductors about 0.001 inch thick and 0.003 inches wide with a hard Au or Ni plating about 25 to 35 microinches thick, the dimensions of the opening in the insulating backing are not usually critical. Where a ground plane is involved in the flex tape structure, the opening must be such that clearance to prevent shorting to the ground plane is provided. The openings in the backing are formed simply by masking and etching with an etch that attacks the backing at a greater rate than it attacks the conductors.

The flex tapes come in a wide variety of conductor pitches and it is frequently advantageous to use flex tape pitches that provide the ability to accommodate lands of different sizes. Large lands can have more than one narrow conductor going to another land. This capability reduces the need for fan out sections.

Referring to FIG. 7, a fine conductor pitch tape is illustrated with an insulating backing 51 having openings 52 and 53 in the insulating backing 51 coinciding with rows of large 54 and smaller 55 lands. In one instance there are three conductors 56 between different types of lands whereas in another instance there are two conductors 57. This capability is useful in providing ability to match different size lands on the external wiring planar member with those on the device supporting planar member and in providing flexibility in current carrying capacity.

In connecting the conductors on a flex tape to lands in wiring, the use of the bump technology well developed in the art may be employed. In the bump technology, a raised bump on one surface, usually produced by localized deposit or fusing of conductive material is used to locate the connection.

Referring to FIG. 8, a side view is provided of a portion of flex tape adapted for elastomeric responsive conductor contacting positioned over a bump type contact. The bump contact 60 is positioned on the conductor or land at the end of the conductor 61 on a planar element. The flex tape 62 is adapted by providing an opening 63 in the insulating backing 64 leaving the conductors 65 unsupported over the bump 60. The bump 60 then serves to reduce the travel of the conductors 65 to contact the conductor 61, simplifies registration of the flex tape in contacting and relaxes the amount of elastomer needed at that point.

Another flex tape adaptation illustrated in FIG. 9 involves providing a hole 66 through the insulating backing 67 to a specific conductor 68. A bump 69 is then formed usually by plating first in the hole 66 and then over the insulating backing 67. The bump is then available for ease of registration and improved contacting with a land 70.

The contacting and overall construction is illustrated in a side view in FIG. 10 wherein the mounting element 8 is positioned at a contacting interface 72 on an external wiring member 73 with conductors 74 thereon. A flex tape 75 is sandwiched in the interface 72, extends over the surface 76 of the mounting element 8 and around the inside of, thereby lining the groove 7. The device supporting member 1 is positioned in the groove 7 in contact both top and bottom with the flex tape. Contact to the conductors at the edge 77 of the device supporting member 1 can be made at the top or bottom in the groove 7.

In constructions, where needed, it is also possible to provide end contact to conductors on the device supporting element 1 through holes formed in the mounting member 8 shown dotted as 78. A pressure plate 79 is positioned on the mounting element 8 with alignment pins or pressure is applied as illustrated by bolt 80, which compresses the elastomeric properties in the groove 7 of the element 8, thereby providing movement free contacts in the groove 7 and in the interface 72 and solid support for the device supporting planar member 1.

The invention permits visual alignment of the conductors on the planar elements and the conductors on the flex tape. The alignment is illustrated in connection with FIG. 11 which is a top view of a schematic assembly apparatus. In the apparatus of FIG. 11, on a support 81, the device supporting planar member 82 is shown schematically with a row of conductor lands 83 along an edge 84. The flex tape 85 is shown having conductor pitch redundancy, that is, a greater number of conductors than there are lands to be connected. Coarse registration pins 86 in the support hold the flex tape 85 in position while the lands 83 are visually aligned with groups of conductors. When alignment is satisfactory, the flex tape 85 is clamped around and to the device supporting planar member 82 for insertion into the groove 7 of the mounting member 8 shown in the other Figures. It will be apparent that the tape can be aligned to the conductors on the external wiring planar member in a similar manner.

The invention provides significant advantages when employed in constructions where the device supporting planar member is in an angular position with respect to the external wiring planar member. In a wide range of electronic apparatus devices are supported on planar members and conductors at the edge of the planar members are gripped by connectors that are strong enough to retain the planar members in position with the connectors in turn being connected to external wiring. The use of a flex tape that enters the holder for the device planar members provides external wiring connections with the full conductor periodicity of the flex tape, a considerable increase over the conventional connectors.

Figure 12:
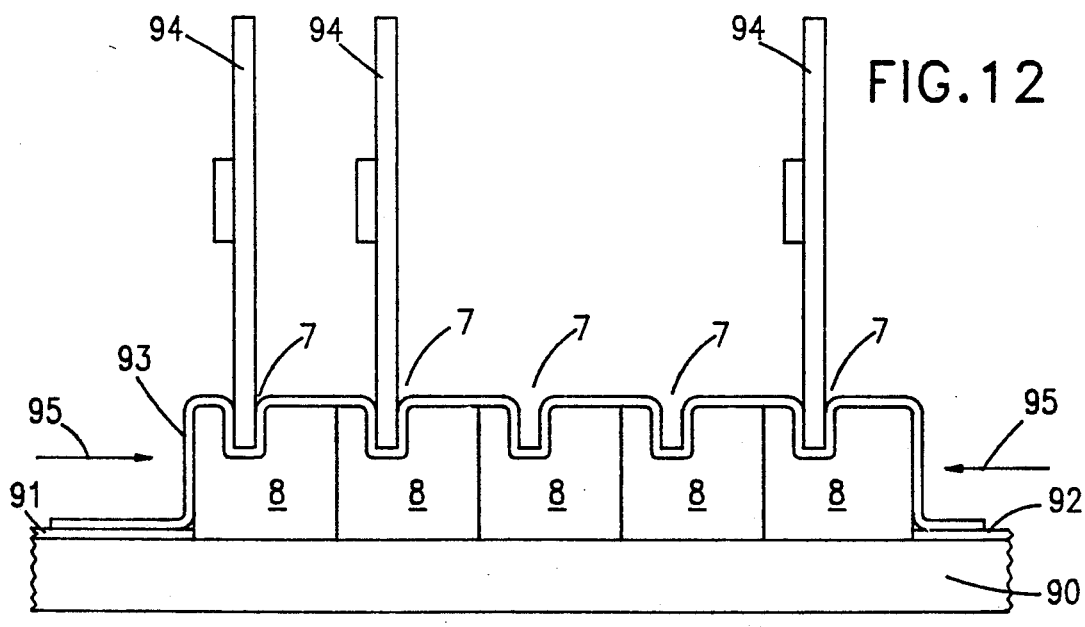
FIG. 12 is a side view of a schematic angularly positioned device supporting planar structure employing elastomeric mounting and interconnecting.

Referring to FIG. 12, a side view is shown of a schematic, angularly positioned, device supporting planar structure, employing the invention. In FIG. 12, a series of mounting members 8, each with a groove 7, are shown mounted on an external wiring supporting member 90 with conductors 91 and 92 thereon. A flex tape 93 has conductors thereon connected to conductor 91 and is positioned over the surface of the mounting members 8, inserted into and lining each groove 7, continuing to and being connected to conductor 92. Three exemplary device supporting planar members 94 are shown each inserted into a flex tape 93 lined groove 7. The remaining two grooves 7 are left vacant for clarity of illustration. Connections to device conductors, not shown, on the planar members 94 in the grooves 7, are made as shown in the other Figures. In the angular construction illustrated in FIG. 12, the retention 15 of FIGS. 1 and 2 has two components. There is a first component labelled 95 as dashed arrows providing compression to the grooves 7 and there may be a second component, not shown, that holds the mounting members 8 to the member 90. The second component can be provided by a similar assembly of members 8 supporting the opposite sides of members 94. It will be apparent that if the member 90 and the members 8 are all one piece with merely elastomeric properties in the grooves 7, the retention 95 would be all that is needed. The members 94 can be at angles other than perpendicular to the members 8 where, for example, clearance benefits are achieved.

The invention is particularly adaptable to constructions that assist in heat dissipation. The mounting members serve as members of an enclosure for enhanced heat conductivity. This is illustrated in connection with FIG. 13 wherein the device supporting planar member 100 supported on all edges by mounting elements 8, two of which are shown in this side view, is covered by a full pressure plate 101, so that with the external wiring planar member 102 there is a cavity 103 above and 104 below the heat generating devices. The cavities 103 and 104 can be filled with a convection fluid such as a thermal grease or a gas such as air or a liquid can be circulated through them.

Figure 13:
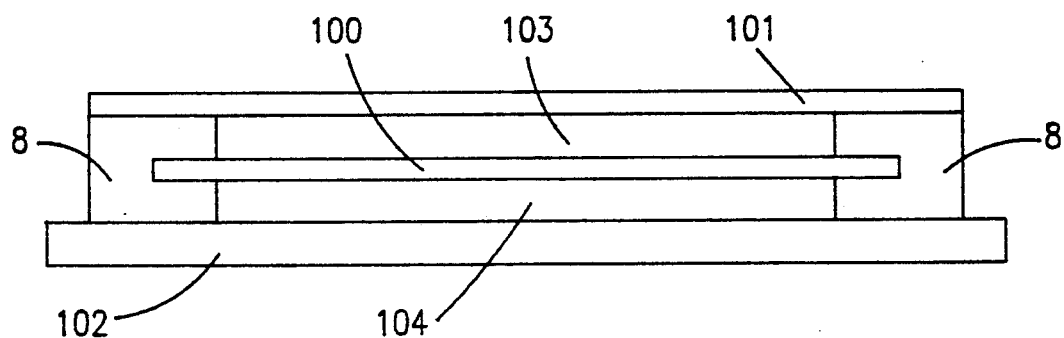
FIG. 13 is a side view of a schematic illustration of an integrated circuit substrate mounted at opposite edges and retained by a pressure plate.
Figure 14:
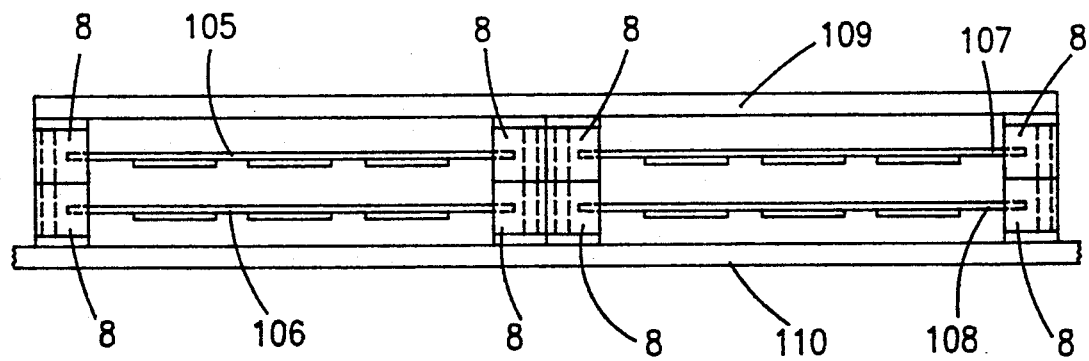
FIG. 14 is a schematic illustration of an assembly of four device supporting substrates mounted in superimposed relationship.

The invention is also particularly adaptable to the packaging of parallel processing or data storage units employing the stacking capability of the mounting elements. An illustration is provided in the schematic assembly in FIG. 14 wherein four device supporting planar members 105-103 are supported on stacked mounting elements 8, in superimposed relationship under a common pressure plate 109 and over a common external wiring planar member 110. The heat dissipation capability described in connection with FIG. 13 is present in the structure of FIG. 14.

What has been described is an elastomeric interconnection technology that provides controlled impedance matching connection and does not require special tools or heat.

Having thus described our invention, what we claim as new and desire to secure by Letters Patent is:

1. A structure comprising:
   a body,
      said body having at least one notch,
   a flex tape member at least lining said notch,
      said flex tape member having at least one conductor,
      said flex tape member further having elastomeric properties,
   at least one device supporting substrate,
      said substrate having an edge with at least one device conductor at said edge,
      said edge being inserted into said notch, and
      said body being subjected to force operable to compress at least one flextape conductor into contact with at least one device conductor in said notch.

2. A structure comprising:
   a plurality of bodies in superimposed relationship
      said superimposed bodies positioned in contact with external wiring on a planar external wiring member,
      each said body having at least one notch,
      each said body having elastomeric properties at least in said notch,
   at least one device supporting substrate having an edge with a device conductor at said edge and with said edge inserted into a notch,
   at least one interconnecting conductor on flex tape lining each notch around the substrate edge and extending into an interface between said superimposed bodies and said planar external wiring member and into contact with said external wiring, and,
   compression force on said superimposed bodies operable to compress said at least one conductor on said flex tape into contact with said at least one device conductor in each notch with a substrate edge and to compress at least one interconnecting conductor into contact with external wiring in said interface.

3. The structure of claim 2 wherein each said interconnection conductor is unsupported by the insulating backing of said flex tape in the region of contact with at least one of said device conductors and said external wiring conductors.

4. The structure comprising in combination:
   a device supporting planar member having device conductors extending to at least one contact location at an edge of said member,
   a mounting member having a notch,
      said edge being inserted into said notch,
   an external wiring planar member with at least one external wiring conductor,
   a flex tape having at least one interconnecting conductor,
      said flex tape having at least one interconnecting conductor extending into said notch in contact with said at least one contacting location on said edge in said notch and in contact with said at least one external wiring conductor on said external wiring planar member,
      said flex tape having elastomeric properties at least in said notch, and, force applied to said mounting member and said external wiring planar member and operable for compression of said notch and retention of said mounting member on said external wiring support member.

5. A structure comprising in combination:

a plurality of device supporting planar members each having device conductors extending to at least one contact location at an edge of said member, a plurality of superimposed mounting members each having a notch, said edge of each said device supporting planar member being inserted into the notch in one of said superimposed mounting members, an external wiring planar member with at least one external wiring conductor, a flex tape having at least one interconnecting conductor, said flex tape having at least one interconnecting conductor extending into said notch in contact with each said at least one contacting location on each said edge in the notch in each of said superimposed plurality of mounting members and in contact with said at least one external wiring conductor on said external wiring planar member, force applied to said superimposed mounting members and said external wiring planar member and operable for compression of each said notch and retention of said superimposed mounting members on said external wiring support member.

6. The structure of claim 5 wherein said elastomeric properties are provided by said flex tape.

7. A structure comprising:

a body of elastomeric material, said body having an approximately rectangular cross section, said body further having first and second approximately parallel surfaces, said body still further having a device substrate accomodating sized notch in the region of said elastomeric body between said surfaces, said notch being approximately parallel to said surfaces and extending through a portion of said body, at least one interconnection conductor supported by said body and at least extending into said notch and to an adjacent one of said surfaces, and, pressure means compressing said body between said surfaces, said pressure means being operable to deform said body and compress said notch.

8. The structure of claim 7 wherein said at least one interconnection conductor supported by said body and at least extending into said notch is, within said notch, unsupported by the insulating backing of said flex tape in the region of contact with at least one conductor on a device supporting substrate positioned within said notch.

9. The structure of claim 7 wherein said at least one interconnection conductor is on a flex tape.

10. The structure of claim 7 including said body being positioned on an external wiring planar member with said at least one interconnection conductor extending over the surface of said body to, and contacting at least one external wiring conductor on, said external wiring planar member.

11. The structure of claim 10 wherein said contacting of said at least one interconnection conductor and said at least one external wiring conductor is in the interface between one of said surfaces of said body and said external wiring planar member and said pressure means to which said body is subjected is also operable to compress said interface between said body and said external wiring planar member.

12. The structure of claim 11 where said at least one interconnection conductor is on flex tape.

13. The structure of claim 7 wherein at least one said body is positioned on an external wiring planar member with said notch at an angle to the plane of said external wiring planar member.

14. The structure of claim 13 wherein said at least one interconnection conductor is on a flex tape.

15. The structure of claim 14 wherein each said interconnection conductor is unsupported by the insulating backing in the region of contact with at least one of said device conductors and conductors on said external wiring planar member.

* * * * *